United States Patent [19]

Fujimura

[11] Patent Number: 5,315,148

[45] Date of Patent: May 24, 1994

[54] PHOTO-SENSING DEVICE

[75] Inventor: Yasushi Fujimura, Osaka, Japan

[73] Assignee: Sumitomo Electric Industries, Ltd., Japan

[21] Appl. No.: 124,661

[22] Filed: Sep. 9, 1993

Related U.S. Application Data

[63] Continuation of Ser. No. 751,191, Aug. 29, 1991, abandoned.

[30] Foreign Application Priority Data

Aug. 31, 1990 [JP] Japan ................................ 2-230207

[51] Int. Cl.$^5$ ............................................ H01L 31/10
[52] U.S. Cl. ................................... 257/458; 257/459; 257/461; 257/743; 257/744
[58] Field of Search ....................... 357/30, 25, 52, 84; 257/458, 459, 461, 743, 744

[56] References Cited

U.S. PATENT DOCUMENTS

| 4,903,103 | 2/1990 | Yamashita et al. | 357/84 |
| 5,057,891 | 10/1991 | Torikai | 357/52 |

FOREIGN PATENT DOCUMENTS

| 215290 | 3/1987 | European Pat. Off. |
| 354280 | 2/1990 | European Pat. Off. |
| 61-95580 | 5/1986 | Japan |
| 62-2673 | 1/1987 | Japan |
| 63-207184 | 8/1988 | Japan |

OTHER PUBLICATIONS

European Search Report and Annex.
Patent Abstracts of Japan, vol. 10, No. 24, Jan. 30, 1986 & JP-A-60 182778 (Fujitsu) Sep. 18, 1985.
Patent Abstracts of Japan, vol. 3, No. 129, Oct. 26, 1979 & JP-A-54 107376 (Nippon Denki K.K.) Aug. 23, 1979.
C. S. Yin et al, "High Quantum Efficiency p+/pi/n−/n+ Silicon Photodiode", IEE Proceedings J. Optoelectronics, vol. 137, No. 3 Jun. 1990, Stevenage GB, pp. 171–173.
S. Kagawa et al, "Wide-wavelength InGaAs/InP PIN Photodiodes Sensitive From 0.7 to 1.6 mum", Japanese Journal of Applied Physics, vol. 28, No. 10, Oct. 1989, Tokyo JP pp. 1843–1846.

Primary Examiner—Eugene R. LaRoche
Assistant Examiner—Viet Q. Nguyen
Attorney, Agent, or Firm—Beveridge, DeGrandi, Weilacher & Young

[57] ABSTRACT

A region of a second conductivity type is selectively formed in a portion of a semiconductive layer of a first conductivity type to form a pn junction area which serves as a photo-sensing region. A metal film is formed on a surface of the semiconductive layer of the first conductivity type to surround the photo-sensing region. When light to be directed to the photo-sensing region spreads outside the photo-sensing region, the light is reflected by the metal film provided on the surface of the semiconductive crystal layer around the photo-sensing region. Accordingly, the light does not reach the photo-sensing layer of the semiconductive crystal layer and the generation of undesired carriers is prevented.

9 Claims, 7 Drawing Sheets

PHOTO-SENSING DEVICE

This application is a continuation of application Ser. No. 07/751,191, filed Aug. 29, 1991, which application is entirely incorporated herein by reference, now abandoned.

BACKGROUND OF THE INVENTION

1. Field of the Invention

The present invention relates to a photo-sensing device used for monitoring an output of a semiconductor laser or as a photo-sensor of a light communication system.

2. Related Background Art

Figure 1A:
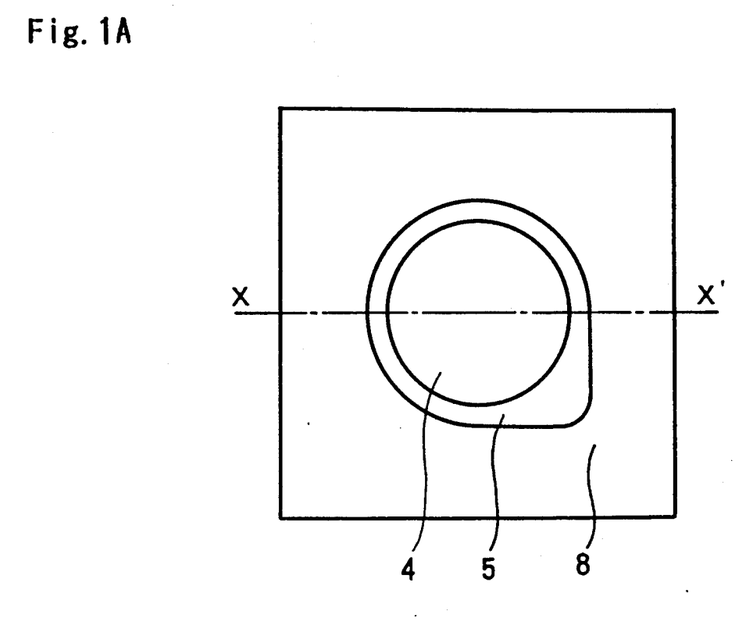
FIGS. 1A and 1B respectively show a structure of a prior art photo-sensing device, FIGS. 2A and 2B respectively show a light pulse response characteristic measured for a prior art structure and the structure of the present invention, FIGS. 3A and 3B respectively show a basic structure of a photo-sensing device of the present invention.
Figure 1B:
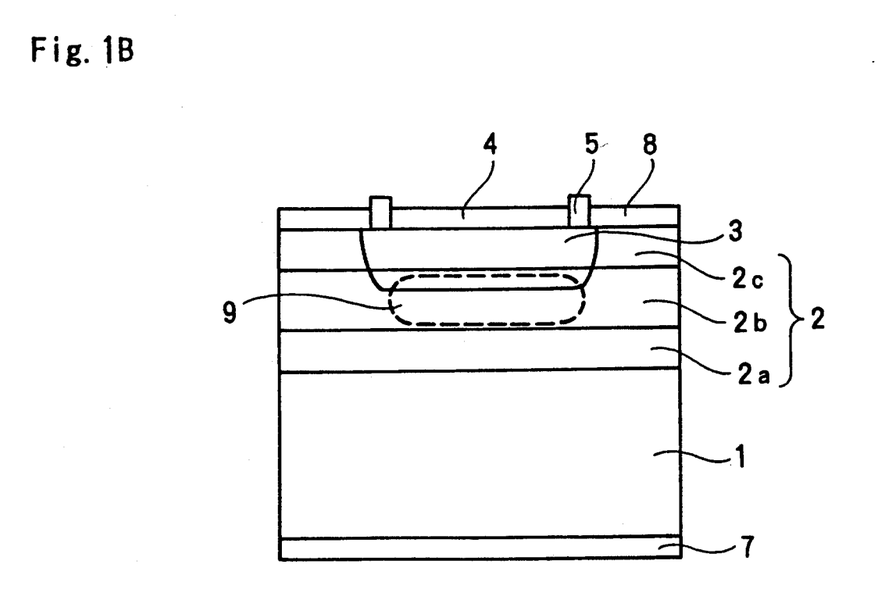

FIGS. 1A and 1B respectively show a top view and an X—X' sectional view of a structure of a prior art photo-sensing device. As shown, in the prior art photo-sensing device, a semiconductive crystal layer 2 of a lightly doped first conductivity type is formed on a surface of a semiconductor substrate 1 of a heavily doped first conductivity type, having an electrode of the first conductivity type formed on an underside thereof. The semiconductive crystal layer 2 is lamination of a buffer layer 2a, a photo-sensing layer 2b and a window layer 2c, in sequence. Impurities are selectively diffused into the semiconductive crystal layer 2 to form a first region 3 of a second conductivity type. This is a pin photo-diode structure where the semiconductor layer 1 is an n layer (or a p layer), the semiconductive crystal layer 2 is an i layer and the first region 3 is a p layer (or an n layer), and a photo-sensing region 9 is formed therein. An electrode 5 of a second conductivity type is formed on the region 3 on the surface of the semiconductive crystal layer 2, and the region 3 inside the electrode 5 is covered with an anti-reflection film 4 while the semiconductive crystal layer 2 outside the electrode 5 is covered with a device protection film (i.e. passivation film) 8.

When a reverse bias is applied to the semiconductor device thus constructed, a depletion layer is created in a pn junction area in the semiconductive crystal 2. Thus, an electric field is developed in the depletion layer and electrons and holes generated by a light applied to the photo-sensing region 9 are directed to the first conductivity type semiconductor substrate 1 and the second conductivity type region 3 of different conductivity types, respectively, and accelerated thereby. In this manner, a photo-current is taken out and a light signal is detected.

Figure 2A:
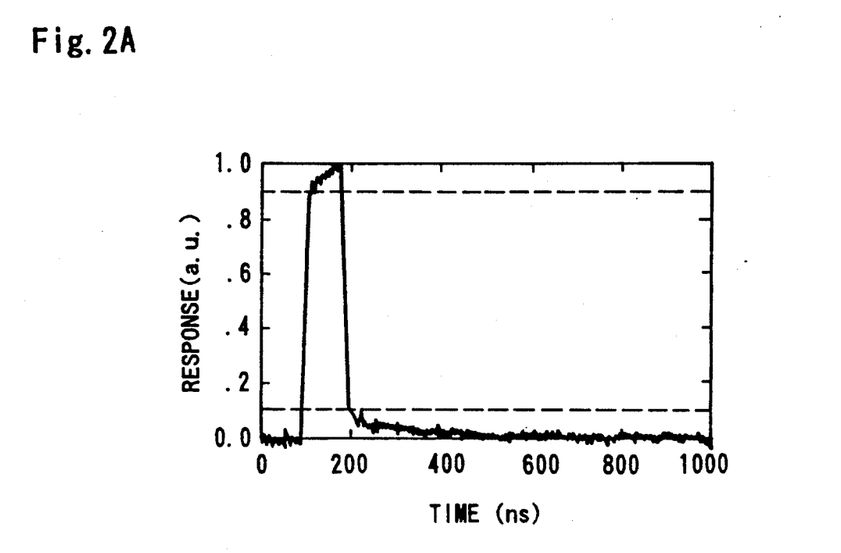

However, in the structure shown in FIGS. 1A and 1B, when the light is directed to the outside of the region 9, the generated carriers reach the pn junction while they are diffused by a density gradient and are taken out as a photo-current. Since the movement of the carriers by the diffusion is slow, a response waveform to a light pulse includes a tail at the end as shown in FIG. 2A. When such a photo-sensing device is used for the light communication, a light emitted from an optical fiber is condensed so that it is directed to the photo-sensing region 9. However, when a portion of light leaks out of the photo-sensing region 9, it leads to the reduction of the response speed of the photo-sensing device by the reason described above. In a high speed photo-sensing device, the area of the photo-sensing region 9 is reduced to reduce a junction capacitance. As a result, a ratio of light directed to the outside of the photo-sensing region 9 increases and a diffused component which has a low response speed increases. This leads to the degradation of the response speed.

When the light emitted from a rear end plane of the semiconductor laser is sensed by the photo-sensing device to feedback-control a drive current for the semiconductor laser in order to keep the light output of the semiconductor laser at a constant level, if the light emitted from the semiconductor laser spreads to the outside of the photo-sensing region 9 of the photo-sensing device, a low response speed component is generated by the diffusion as described above. This adversely affects to the feedback control.

SUMMARY OF THE INVENTION

It is an object of the present invention to provide a photo-sensing device which solves the above problems.

A photo-sensing device of the present invention has a structure having a pn junction area, as a photo-sensing region, formed by selectively providing a region of a second conductivity type in a portion of a semiconductor layer of a first conductivity type. A metal film is formed on a surface of the semiconductive layer of the first conductivity type to surround the photo-sensing region.

Accordingly, even if the light is directed to the outside of the photo-sensing region, the light is reflected by the metal film provided on the surface of the semiconductive crystal layer around the photo-sensing region. Accordingly, the light does not reach the photo-sensing layer in the semiconductive crystal layer, and the generation of undesired charges is prevented.

It is further object of the present invention to provide a photo-sensing device having a pn junction area, as a photo-sensing region, formed by selectively providing a heavily doped region of a second conductivity type in a portion of a lightly doped semiconductive layer of a first conductivity type formed on a heavily doped semiconductor substrate of the first conductivity type, characterized in that: a metal film is formed on the semiconductive layer of the first conductivity type around the region of the second conductivity type.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The embodiments of the present invention are now explained with reference to the drawings.

Figure 3A:
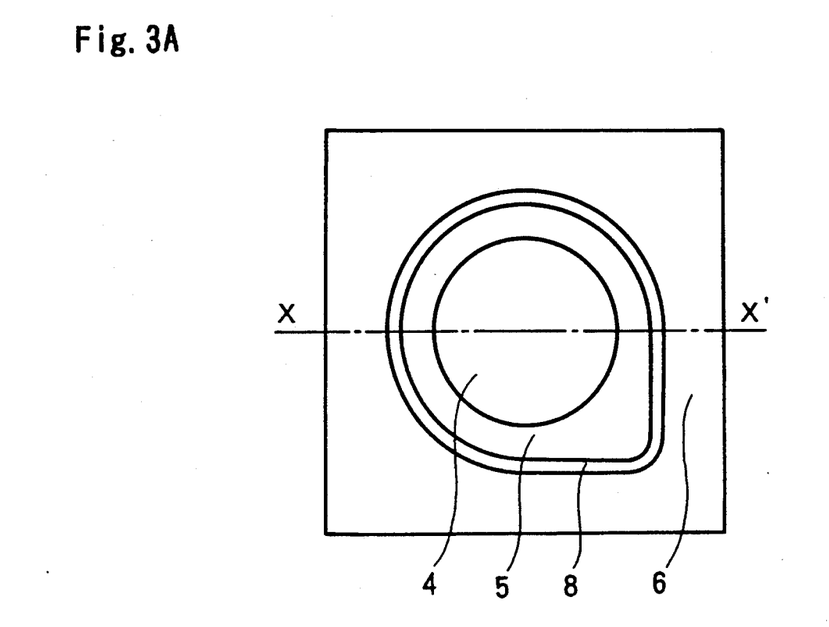
Figure 3B:
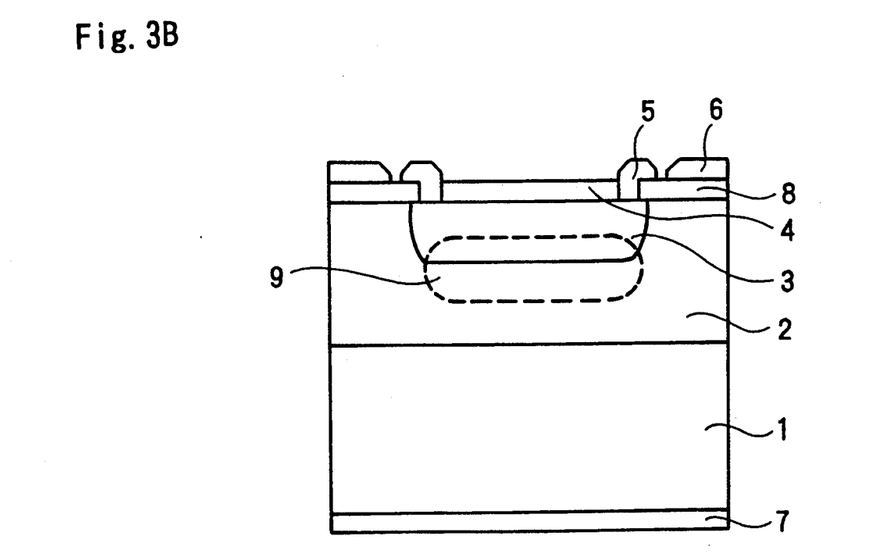

FIGS. 3A and 3B respectively show a basic structure of a photo-sensing device of the present invention.

FIG. 3A show a top view and FIG. 3B shows an X—X' sectional view. As shown, a photo-sensing layer 2 of a lightly doped first conductivity type is formed on a surface of a semiconductor substrate 1 of a heavily doped first conductivity type having a electrode 7 of the first conductivity type formed on an underside thereof, and a region 3 of a second conductivity type is formed by impurity diffusion. A pn junction area formed by the provision of the region 3 is used as a photo-sensing region 9. A p-electrode 5 is formed on the first region 3 on the surface of the semiconductive crystal layer 2, and an anti-reflection film 4 is formed on the first region 3 inside the electrode 5 while a device protection film 8 is formed on the semiconductive crystal layer 2 outside the electrode 5. A metal film 6 is coated on the device protection film 8 with a predetermined spacing from the electrode 5.

In the structure such as the above embodiment in which the semiconductive crystal layer 2 is used as an i layer of a pin photo-diode, generally, the addition of the impurities is not performed in the crystal growth. But the semiconductive crystal layer may become the first conductive type semiconductor layer by locally stoichiometric shift in some kind of the material or by mixture of the impurities from a crystal growing apparatus etc. Further, in order to improve the electrical characteristics of an device, the impurities may be added in formation of the semiconductor crystal layer 2. Therefore, in the present application, the meaning of "lightly doped" also includes a case that "the intentional addition of the impurities is not performed".

When a reverse bias is applied to the semiconductor device thus constructed, a depletion layer is created in the pn junction area in the semiconductive crystal layer 2. Thus, an electric field is developed in the depletion layer and electrons and holes generated by the light directed to the photo-sensing region 9 are directed to the first conductivity type semiconductor substrate 1 and the second conductivity type region 3, respectively, and accelerated thereby. In this manner, a photo-current is taken out and a light signal is detected. On the other hand, even when the light is spread to the outside of the photo-sensing region 9, the light is reflected because of the provision of the metal film 6 on the surface of the semiconductive crystal layer 2 around the region 3. Accordingly, the light does not reach the photo-sensing layer in the semiconductive crystal layer 2 and the generation of undesired charges is prevented.

Figure 4A:
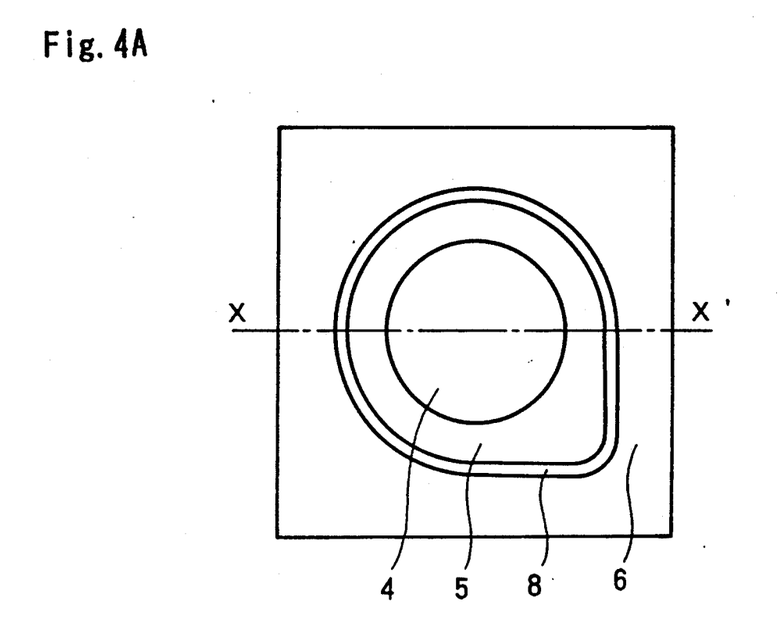
FIGS. 4A and 4B respectively show a structure of a photo-sensing device in accordance with a first embodiment of the present invention.
Figure 4B:
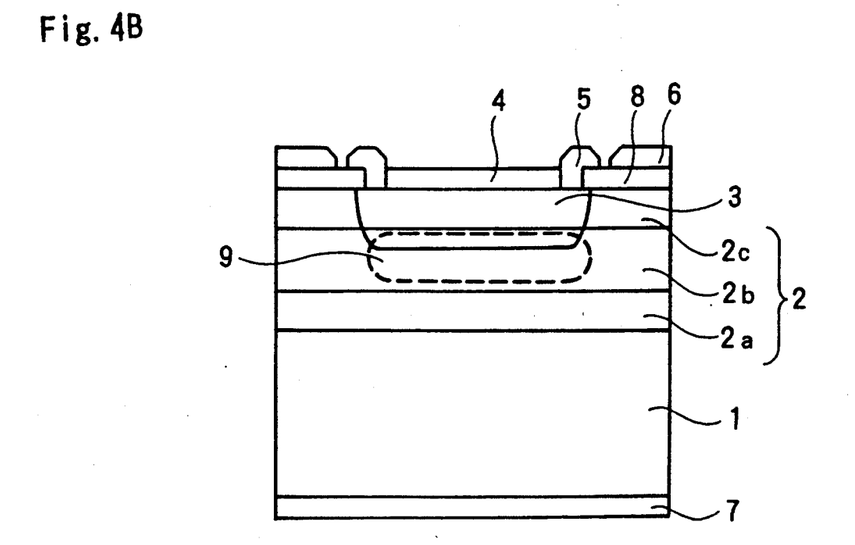

Specific embodiments based on the above basic structure are now explained, FIGS. 4A and 4B respectively show a structure of a first embodiment. FIG. 4A shows a top view and FIG. 4B shows an X—X' sectional view. As shown, a non-doped InP buffer layer 2a (dopant concentration $n=2 \times 10^{15}$ cm$^{-3}$, thickness 2 $\mu$m), a non-doped InGaAs (indium-gallium-arsenide) photo-sensing layer 2b ($n=2 \times 10^{15}$ cm$^{-3}$, thickness 3.5 $\mu$m) and a non-doped InP window layer 2c ($n=2 \times 10^{15}$ cm$^{-3}$, thickness 2 $\mu$m) are formed on a surface of an n$^+$-type InP (indium-phosphide) semiconductor substrate 1 ($n=2 \times 10^{18}$ cm$^{-3}$) having an n-electrode 8 formed on an underside thereof. A p-type region 3 is formed on the light absorption layer by selective diffusion of Zn (zinc) by a sealed ampoule method (impurity doping method using a sealed silica tube including a semiconductor wafer and an impurity material). A p-electrode 5 is formed in the first region 3 in the semiconductive crystal layer 2, and an anti-reflection film 4 is formed on the first region 3 inside the electrode 5 and a device protection film 8 is formed on the semiconductive crystal layer 2 outside the electrode 5. Further, a metal film 6 is formed on the device protection film 8. A constant spacing of 5 $\mu$m is kept between the metal film 6 and the p-electrode 5 and the metal film 6 surrounds the p-electrode 5. In the present embodiment, a diameter of the p-type region 3 is smaller than an inner diameter of the metal film 6 so that the metal film 6 is present only on the n-type region.

Figure 5:
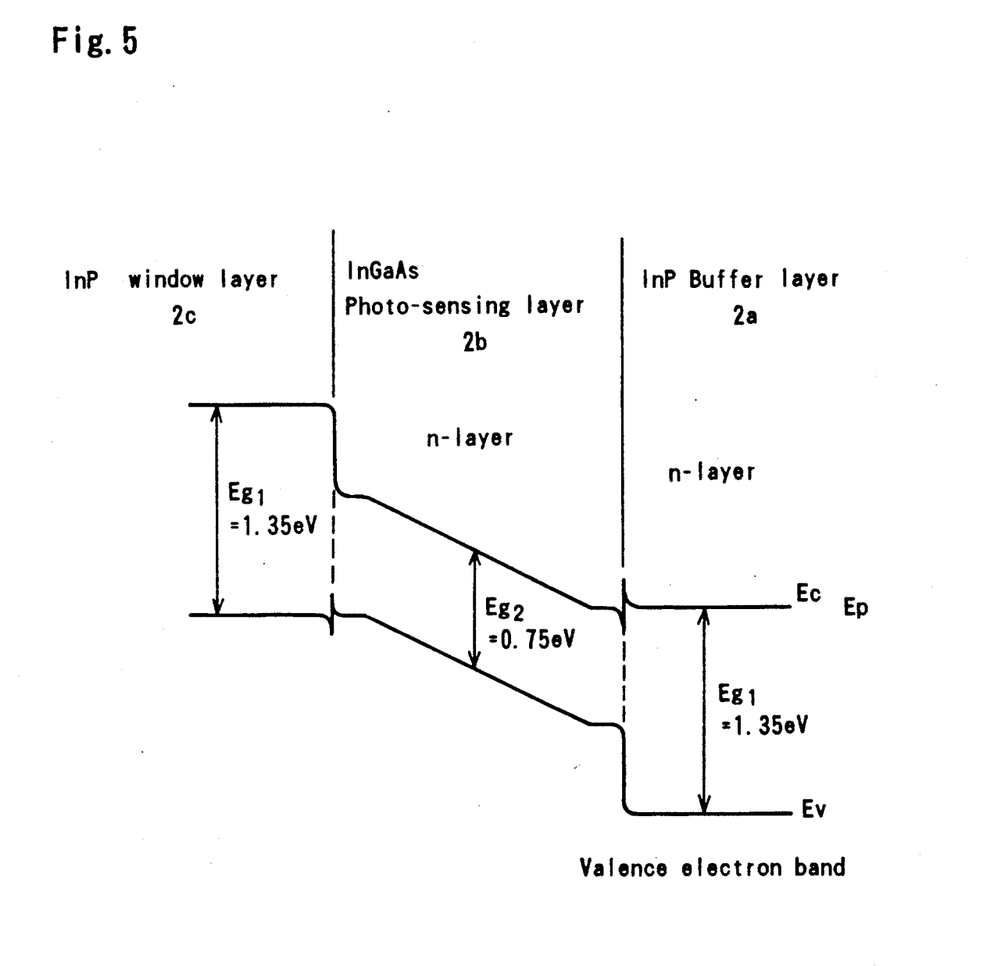
FIGS. 5 show a band gap energy chart of the photo-sensing device structure of the first embodiment, FIGS. 6A and 6B respectively show a structure of a photo-sensing device in accordance with a second embodiment of the present invention.

A band gap energy chart of the pin structure is shown in FIG. 5. In the present embodiment, the composition of InGaAs of the photo-sensing layer 2b is In$_{0.53}$Ga$_{0.47}$As. This composition provides the smallest band gap energy, that is, it can sense the longest wavelength light among the InGaAsP semiconductors which can be lattice-matched with the InP layer.

It is preferable that the thickness of the photo-sensing layer 2b is between 1 $\mu$m and 7 $\mu$m to improve an absorption efficiency of the incident light, although it is not limited thereto. It is further preferable that a spacing between the p-electrode 5 and the surrounding metal film 6 is between 2 $\mu$m and 30 $\mu$m to attain a good response characteristic and stable film formation, although it is not limited thereto.

Figure 2B:
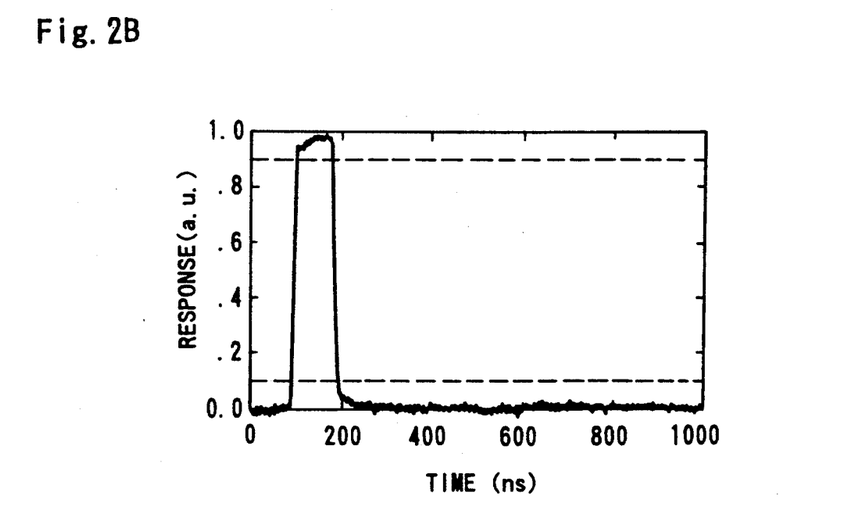

A response speed measured for the present, photo-sensing device is shown in FIG. 2B. Since the stray light spread to the outside of the photo-sensing region does not reach the photo-sensing layer, the degradation of the response speed is prevented. It has been proved that the narrower the spacing between the p-electrode 5 of the photo-sensing device and the surrounding metal film 6, the more is the degradation of the response time prevented.

Figure 6A:
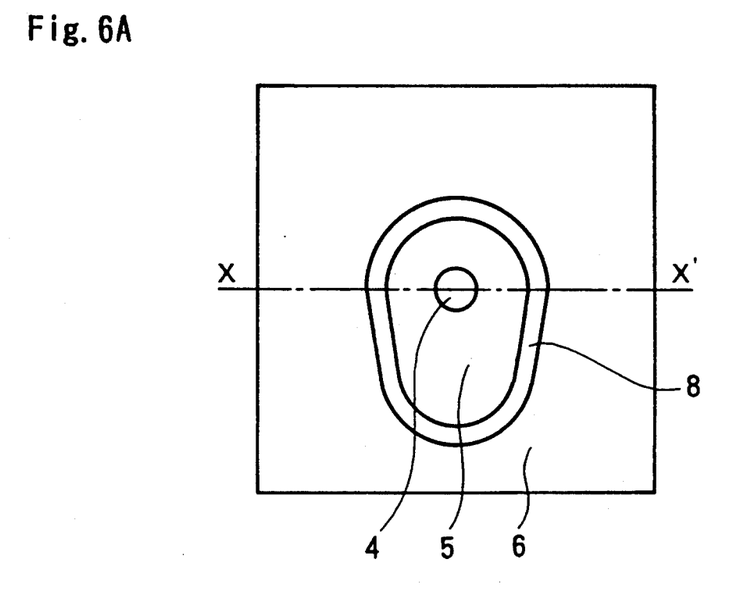
Figure 6B:
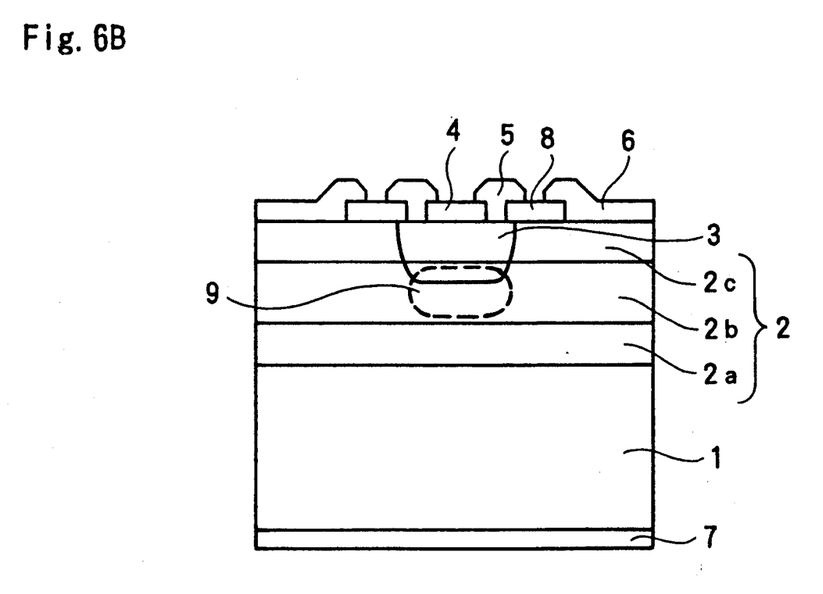

In the present embodiment, the incident light has a wavelength of 1.3 $\mu$m. Since the photo-sensing layer 2b is the In$_{0.53}$Ga$_{0.47}$As layer, the same effect is attained for an incident light of a long wavelength such as 1.55 $\mu$m. A second embodiment is now explained with reference to FIGS. 6A and 6B. FIG. 6A shows a top view and FIG. 6B shows an X—X' sectional view. As shown, a non-doped InP buffer layer 2a ($n=2 \times 10^{15}$ cm$^{-3}$, thickness 2 $\mu$m), a non-doped InGaAs photo-sensing layer 2b ($n=2 \times 10^{15}$ cm$^{-3}$, thickness 3.5 $\mu$m) and a non-doped InP window layer 2c ($n=2 \times 10^{15}$ cm$^{-3}$, thickness 2 $\mu$m) are formed on a surface of an n$^+$-type InP semiconductor substrate 1 ($n=2 \times 10^{18}$ cm$^{-3}$) having an n-electrode 8 formed in sequence on an underside thereof. Further, a p-type region 3 is formed by the selective diffusion of Zn. A diameter of the p-type region 3 is 50 $\mu$m. A p-electrode 5 is formed on the region 3, and an anti-reflection film 4 is formed on the first region 3 inside the p-electrode 5 and a device protection film 8 is formed on the semiconductive crystal layer 2c outside the electrode 5. A metal film 6 is formed on the device protection film 8 and the first conductivity type semiconductive crystal layer 2c. A spacing between the p-electrode 5 and the surrounding metal film 6 is 10 μm.

In the present structure, since the incidence of the stray light is prevented by the metal film around the p-type region 3, the degradation of the response speed is prevented.

Figure 7A:
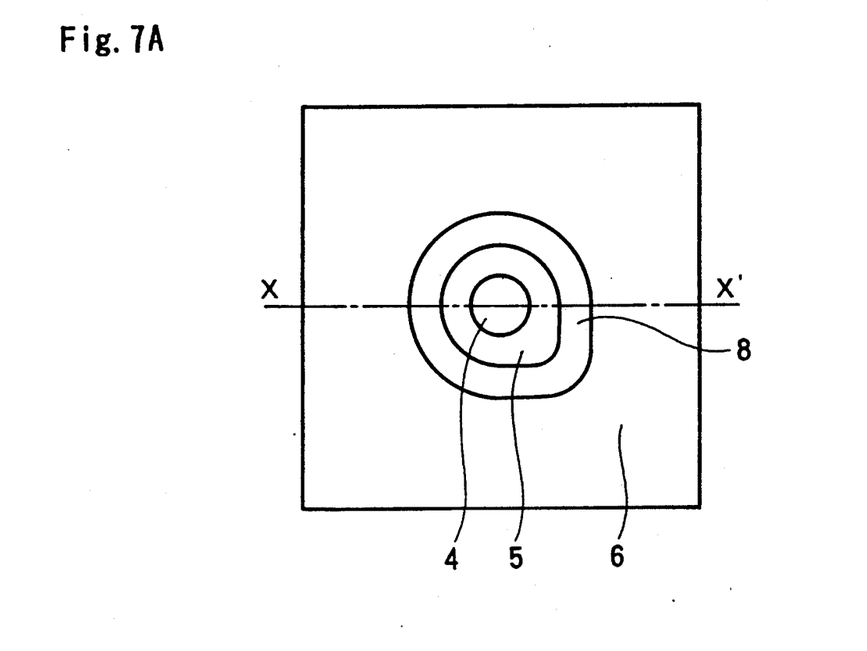
FIGS. 7A and 7B respectively show a structure of a photo-sensing device in accordance with a third embodiment of the present invention.
Figure 7B:
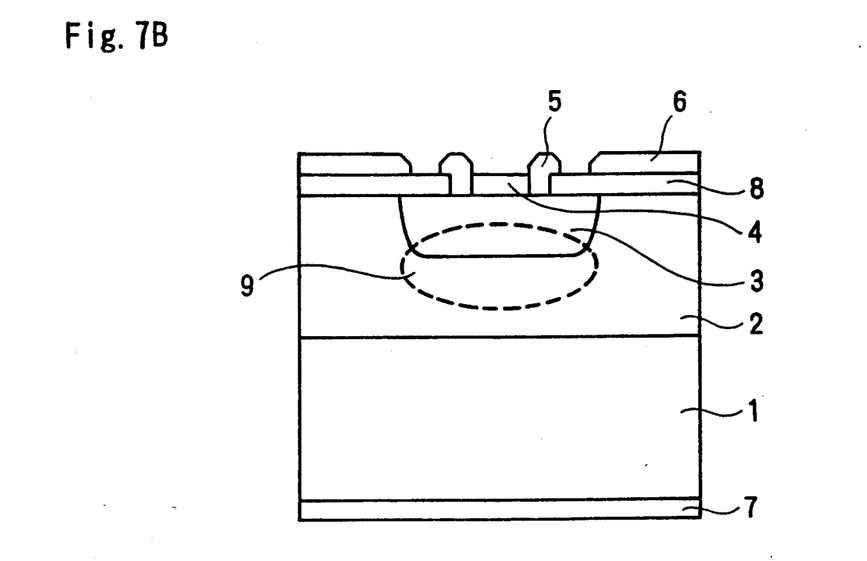

A third embodiment is now explained with reference to FIGS. 7A and 7B. FIG. 7A shows a top view and FIG. 7B shows an X—X' sectional view. In the present embodiment, a non-doped In Ga As photo-sensing layer 2 ($n=1\times10^{15}$ cm$^{-3}$, thickness 5 μm) is formed on an n$^+$-type InP substrate 1 ($n=2\times10^{18}$ cm$^{-3}$) having an n-electrode formed on an underside thereof, and a p-type region 3 is formed by the selective diffusion of Zn. A diameter of the region 3, is 100 μm and a p-electrode 5 is formed on the region 3 and an anti-reflection film 4 is formed on the first region 3 inside the p-electrode 5 and a device protection film 8 is formed on the semiconductive crystal layer 2 outside the electrode 5. Further, a metal film 6 is formed on the device protection film 8. The spacing between the p-electrode 5 and the surrounding metal film 6 is 15 μm. In the present embodiment, the diameter of the p-type region 3 is larger than the inner diameter of the metal film 6 so that the metal film 6 is present in portions of the n-type region and the p-type region 3. It is preferable that the metal film 6 extend into the p-type region 3 by no smaller than 1 μm and is spaced from the periphery of the p-electrode 5 by no smaller than 2 μm, although it is not restrictive.

In the above structure, all light directed to the outside of the photo-sensing region 9 is reflected by the metal film 6 and the light is absorbed only by the photo-sensing region 9. Thus, no charge is generated outside the photo-sensing region 9 and the degradation of the response speed is effectively prevented.

The semiconductor materials and the dimensions thereof are examples and they change depending on applications and wavelengths. For example, the semiconductor materials may be compound semiconductors such as GaAs (gallium-arsenide), InGaAsP (indium-gallium-arsenide-phosphide) AlGaAs (aluminum-gallium-arsenide), CdTe (cadmium-telluride), HgCdTe (mercury-cadmium-telluride), InSb (indium-antimonide), or Si (silicon) or Ge (germanium). The impurities may be Be (beryllium) or Ga (gallium). The impurity diffusion may be done by an ion implantation method.

In accordance with the present invention, the degradation of the response speed is prevented by the simple means of reflecting the light directed to the outside of the photo-sensing region by the metal film formed by vapor deposition on the semiconductor crystal of the first conductivity type around the photo-sensing region, and the high response photo-sensing device is provided.

In the present embodiment, the device protection film is formed on the semiconductive crystal layer, and the metal film is formed thereon. Alternatively, the metal film may be directly formed on the semiconductive crystal layer without intervention of the device protection film.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:
1. A photo-sensing device comprising:
a heavily doped semiconductor substrate of a first conductivity type:
a lightly doped semiconductor layer of said first conductivity type, said lightly doped semiconductor layer being formed on said heavily doped semiconductor substrate;
a heavily doped region of a second conductivity type provided in a portion of said lightly doped semiconductor layer, said heavily doped region and said semiconductor layer forming a p-n junction which provides a photo-sensing region;
an insulating layer formed directly on said lightly doped semiconductor layer and around said heavily doped region;
an electrode contacting said heavily doped region at a main surface thereof; and
a metal layer formed on said insulating layer, said metal layer also contacting said lightly doped semiconductor layer.

2. A photo-sensing device according to claim 1, further comprising an electrode contacting said heavily doped region, said electrode having a portion covering an edge portion of said p-n junction at a main surface of said heavily doped region, on said insulating layer, and a portion contacting said heavily doped region.

3. A photo-sensing device comprising:
a heavily doped semiconductor substrate of a first conductivity type:
a lightly doped semiconductor layer of said first conductivity type, said lightly doped semiconductor layer being formed on said heavily doped semiconductor substrate;
a heavily doped region of a second conductivity type provided in a portion of said lightly doped semiconductor layer, said heavily doped region and said semiconductor layer forming a p-n junction which provides a photo-sensing region, said heavily doped region having a main surface at an upper surface thereof;
an insulating layer formed directly on said lightly doped semiconductor and around said heavily doped region;
an electrode having a first portion which contacts said heavily doped region of said second conductivity type, and a second portion which extends from said first portion onto an upper surface of said insulating layer to beyond an edge of said heavily doped region in the direction of said main surface of said heavily doped region; and
a metal layer formed over said lightly doped semiconductor layer on said insulating layer.

4. A photo-sensing device according to claim 3, wherein said semiconductor layer of said first conductivity type is formed by crystal growth of a semiconductor having the same composition as that of said semiconductor substrate.

5. A photo-sensing device according to claim 3, wherein said semiconductor layer of said first conductivity type is a lamination of a plurality of semiconductor layers having lower impurity concentrations than that of said semiconductor substrate, and at least one of said plurality of semiconductor layers which does not contact said semiconductor substrate has a different composition than that of said semiconductive substrate.

6. A photo-sensing device according to claim 5, wherein said semiconductor substrate is an n$^+$-type InP (indium-phosphide) substrate, and said semiconductor layer is a lamination of a non-doped InP buffer layer, an n-type InGaAs (indium-gallium-arsenide) photo-sensing layer and an n-type InP window layer in sequence.

7. A photo-sensing device according to claim 1, wherein said semiconductive layer of the first conductivity type is made by crystal growth of a semiconductor having the same composition as that of said semiconductor substrate.

8. A photo-sensing device according to claim 1, wherein said semiconductive layer of the first conductivity type is lamination of a plurality of semiconductive layers having lower impurity concentrations than that of said semiconductor substrate, and at least one of said plurality of semiconductor layers which does not contact to said semiconductor substrate has a different composition than that of said semiconductor substrate.

9. A photo-sensing device according to claim 8, wherein said semiconductor substrate is an n+-type InP (indium-phosphide) substrate, and said semiconductive layer is lamination of a non-doped InP buffer layer, an n-type InGaAs (indium-gallium-arsenide) photo-sensing layer and an n-type InP window layer in sequence.

* * * * *